United States Patent
Andelfinger

(10) Patent No.: US 9,304,170 B2
(45) Date of Patent: Apr. 5, 2016

(54) MODULAR HEAVY LOAD BATTERY TEST SYSTEM

(75) Inventor: Richard Andelfinger, Chandler, AZ (US)

(73) Assignee: Bosch Automotive Service Solutions Inc., Warren, MI (US)

( * ) Notice: Subject to any disclaimer, the term of this patent is extended or adjusted under 35 U.S.C. 154(b) by 1156 days.

(21) Appl. No.: 12/054,008

(22) Filed: Mar. 24, 2008

(65) Prior Publication Data

US 2009/0237086 A1 Sep. 24, 2009

(51) Int. Cl.
*G01N 27/416* (2006.01)
*G01R 31/36* (2006.01)
*G01R 1/04* (2006.01)

(52) U.S. Cl.
CPC .............. *G01R 31/3648* (2013.01); *G01R 1/04* (2013.01); *G01R 31/3631* (2013.01)

(58) Field of Classification Search
CPC ........................ G01R 31/3631; G01R 31/3627
USPC .................................................. 324/431, 426
See application file for complete search history.

(56) References Cited

U.S. PATENT DOCUMENTS

| 3,593,099 | A  | * | 7/1971  | Scholl ............... | G01R 31/3627 320/127 |
| 5,254,952 | A  | * | 10/1993 | Salley ............... | G01R 31/3627 324/426 |
| 6,407,918 | B1 | * | 6/2002  | Edmunds et al. ............. | 361/695 |
| 2002/0003423 | A1 | * | 1/2002  | Bertness et al. .............. | 324/426 |
| 2006/0217914 | A1 | * | 9/2006  | Bertness ...................... | 702/113 |
| 2006/0273783 | A1 | * | 12/2006 | Keuss ............... | G01R 31/3631 324/200 |
| 2009/0085571 | A1 | * | 4/2009  | Bertness ............ | B60C 23/0408 324/426 |

* cited by examiner

*Primary Examiner* — Edward Tso
*Assistant Examiner* — Johali Torres Ruiz
(74) *Attorney, Agent, or Firm* — Baker Hostetler LLP

(57) ABSTRACT

A modular heavy load battery test system is provided. The system includes a heavy load module and a battery tester. The heavy load module includes a housing, first and second lengths of high-resistivity, large-gauge wire arranged on respective upper and lower surfaces of a heat-resistant support plate, a switch and at least one cooling fan. The battery tester includes a housing, a microcontroller and a set of battery charging wires. The microcontroller selects the configuration of the first and second wires and provides the control signal to the heavy load module, while the switch selectively connects the first and second wires to the battery tester based upon the control signal.

19 Claims, 5 Drawing Sheets

MODULAR HEAVY LOAD BATTERY TEST SYSTEM

FIELD OF THE INVENTION

The present invention relates generally to battery testers. More specifically, the present invention relates to a portable battery tester employing user-selectable modular heavy loads for vehicular service.

BACKGROUND OF THE INVENTION

Most portable, handheld, lead-acid battery test instruments fall into two categories—conductance testers and micro-load testers. Conductance testers do not apply significant loads to the battery under test. Micro-load testers employ relatively small loads, e.g., on the order of 15-40 amperes, to gauge the battery's condition and status based on the battery's response to, and recovery from, the load. However, several incipient battery problems, such as internal shorts, cannot be readily detected without applying very heavy loads, e.g., on the order of 160 amperes, for several periods of ten or more seconds.

Presently, it is believed that portable battery test instruments do not apply significant battery load testing or charging analysis. While moderate-load battery testers (e.g., 100 A) are presently available, these devices are, generally, simple voltmeters that do not perform an analysis of the battery's condition. These moderate-load testers are also limited to providing a short-term application of the load, typically less than 10 seconds due to rapid heating, and are, generally, of a single, fixed load, i.e., non-configurable. Due to the size of the resistance elements employed within, and the heat generated by, heavy-load testers, these large devices have typically been confined to console-style units or heavy wheeled cabinets used in garages and repair shops. A portable, heavy-load battery tester would be of great benefit and application in many vehicle test and repair scenarios, particularly those involving heavy equipment or large trucks. Additionally, a portable heavy load battery tester would be much easier for a technician to carry to the vehicle, instead of maneuvering a traditional heavy console unit into close proximity to the battery. Field service operations would also benefit from a small, portable heavy load batter tester; this device could be carried to heavy construction equipment located on a job site. Configurability of the load, coupled with a modular format, is also desirable.

SUMMARY OF THE INVENTION

The foregoing needs are met, to a great extent, by the present invention, wherein in one aspect an apparatus is provided that in some embodiments employ user-selectable modular heavy loads and provide unique and significant features and benefits for vehicular service markets. Preferred embodiments of the present invention use resistance wire, configured in a unique manner, to provide a heavy load to the battery under test while advantageously dissipating heat.

In accordance with an embodiment of the present invention, a heavy load module for a modular battery test system includes a housing, with control signal and high current connectors, that encloses first and second lengths of high-resistivity, large-gauge wire arranged on respective upper and lower surfaces of a heat-resistant support plate, a switch and at least one cooling fan. The switch selectively connects the first and second wires to the high-current connector based upon a control signal received over the control signal connector.

In accordance with another embodiment of the present invention, a modular heavy load battery test system includes a heavy load module and a battery tester. The heavy load module includes a housing, first and second lengths of high-resistivity, large-gauge wire arranged on respective upper and lower surfaces of a heat-resistant support plate, a switch and at least one cooling fan. The battery tester includes a housing, a microcontroller and a set of battery charging wires. The microcontroller selects the configuration of the first and second wires and provides the control signal to the heavy load module, while the switch selectively connects the first and second wires to the battery tester based upon the control signal.

In accordance with yet another embodiment of the present invention, a modular heavy load battery test system includes a heavy load module and a battery tester. The heavy load module includes a housing that encloses a configurable load, means for setting the configuration of the load and means for cooling the load. The battery tester includes a housing adapted to receive the heavy load module, means for selecting the configuration of the load, and means for connecting the load to a battery under test.

In accordance with a further embodiment of the present invention, a method for testing a battery using a heavy load includes selecting a heavy load module based upon a capacity of a battery under test, connecting the heavy load module to a battery tester, connecting the battery tester to the battery under test, selecting a load configuration, setting the load configuration and testing the battery. The heavy load module includes a housing that encloses a configurable load and a switch to couple the configurable load to the battery tester.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
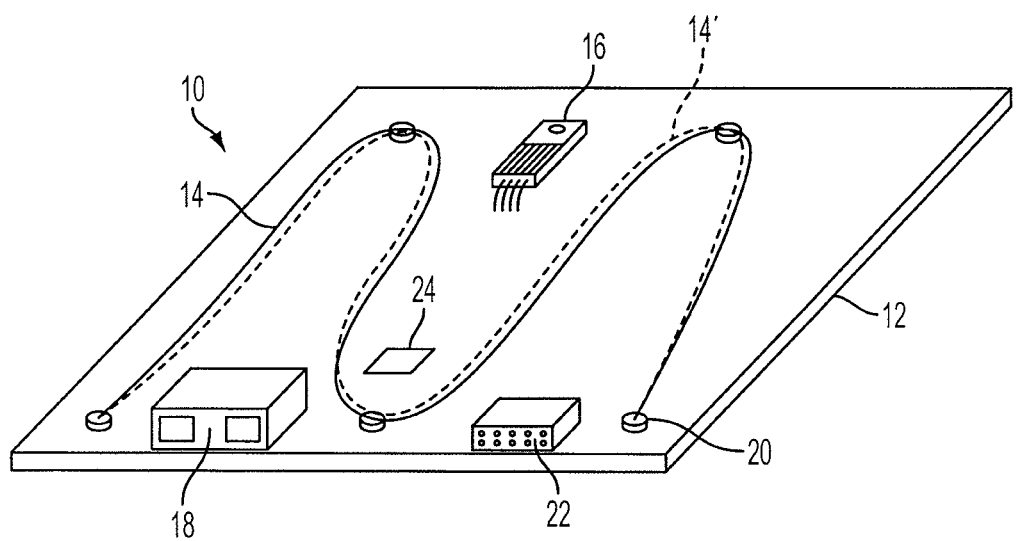
FIG. 1 presents a perspective view of a heavy load module in accordance with an embodiment of the present invention.

The invention will now be described with reference to the drawing figures, in which like reference numerals refer to like parts throughout. A modular heavy-load battery test system allows multiple heavy load modules to be used, in various configurations, to allow testing of multiple battery voltages, primarily 6, 12, and 24 volt systems. The system enables field-installation of these modules, allowing for a single portable device with multiple heavy-load capabilities, a single device with user-selectable heavy-load modules, or no heavy-load capability initially, with the heavy-load capability added-on by the user at any time after the original purchase. The technique of using heavy-gauge resistance wire for high-amperage loads is known in the art, but the application to is novel.

Figure 2:
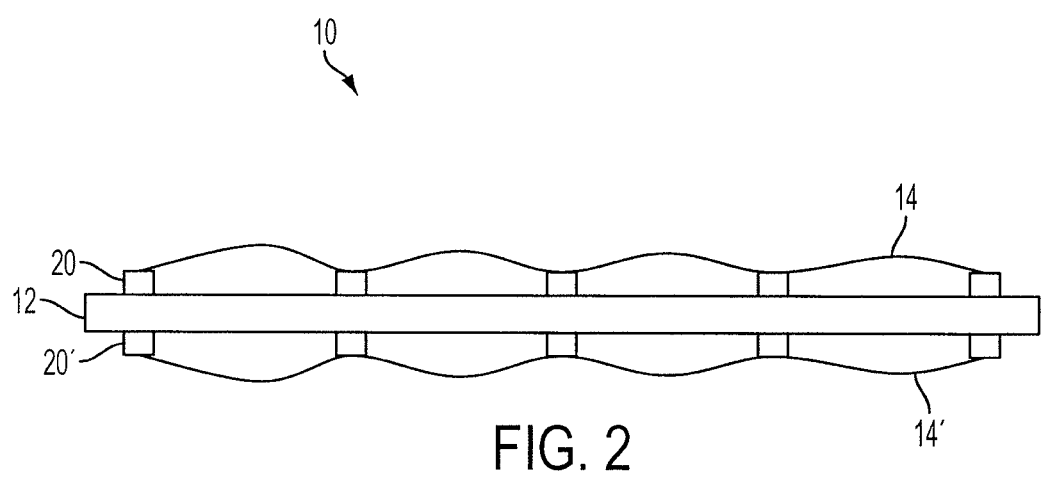
FIG. 2 presents a side view of the heavy load module depicted in FIG. 1.
Figure 3:
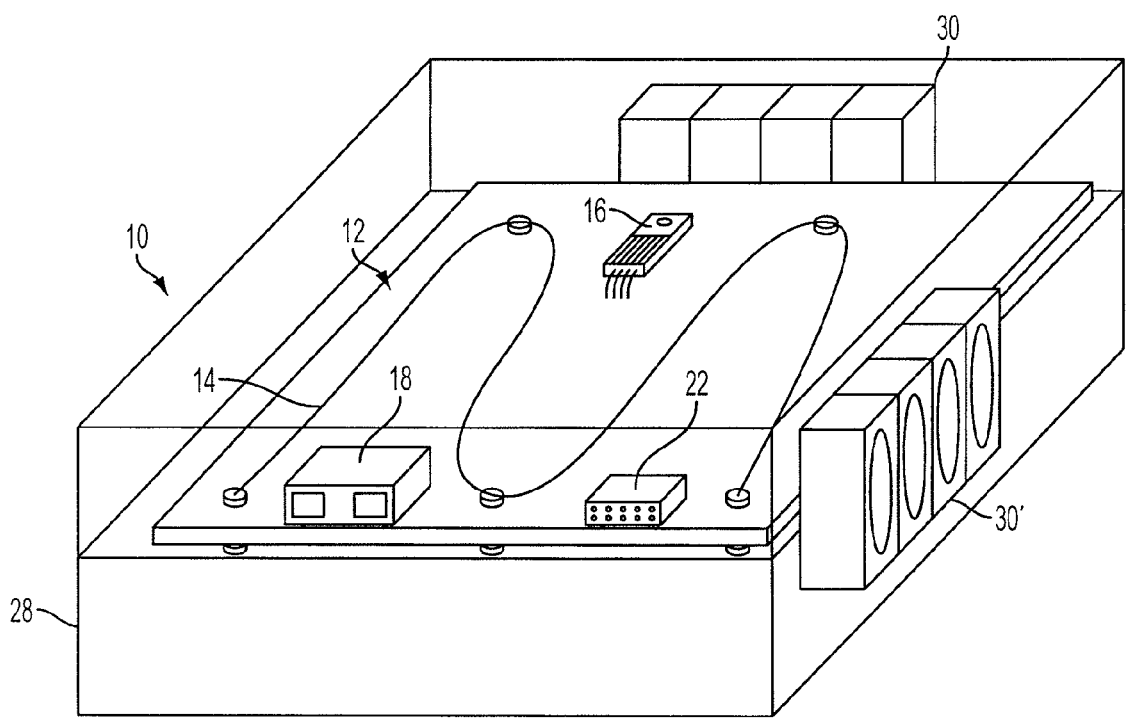
FIG. 3 presents another perspective view of a heavy load module, in accordance with an embodiment of the present invention.

FIGS. 1, 2 and 3 present perspective, side and perspective views, respectively, of a heavy load module in accordance with embodiments of the present invention. Heavy load module 10 includes a heat-resistant support plate 12 which is disposed within housing 28. A first length of high-resistivity large-gauge wire 14, such as, for example, FeCrAl Alloy 919 at AWG 0, is disposed on the top surface of support plate 12, and a second length of high-resistivity large-gauge wire 14' is disposed on the bottom surface of support plate 12. Support plate 12 is constructed of ceramic, millboard, mica or other heat-resistant material capable of withstanding high temperatures. In accordance with one preferred embodiment, each large-gauge wire 14,14' is arranged in an M-shape, and is connected to the support plate 12 via a series of standoff connectors 20, 20' strategically placed to retain wire 14,14' is the desired configuration. Wire connectors 20,20' are ceramic or other high-temperature material(s). As shown in FIG. 2, wires 14,14' and wire connectors 20,20' may be arranged symmetrically, and, in one preferred embodiment, each wire 14,14' has a nominal resistance of 0.15 ohms.

MOSFET switching component 16 is provided on support plate 12, disposed, for example, between the peaks of the M-shaped wires 14,14'. A high current connector 18 and a control connector 22 are situated at one end of support plate 12, and an optional temperature sensor 24 may be located on support plate 12 as well. Additionally, wires 14,14' may be encased in an optional protective shell (not shown), and battery-operated fans 30 may be provided to provide air across wires 14,14' while they are operating as the battery test load. In one preferred embodiment, battery-operated fans 30 are miniature cooling fans that draw power parasitically from the test battery. Fans 30 may be controlled by a fan switching element(s), in order to adapt the electrical connection of the fans to the test battery. One exemplary embodiment includes four 6 volt fans, connected in parallel for a 6V battery, connected in series-parallel for a 12V battery, and connected in series for a 24V system. The fan switching element may select the proper electrical configuration based on an assumed or measured test battery voltage, or, alternatively, based upon a fan control signal received over the control signal connector.

Housing 28 bears high current connector 18 and control signal connector 22, and encloses support plate 12 and its constitute components, including, for example, switch 16, fans 30, optional temperature sensor 24, etc. Alternatively, fans 30 may be otherwise disposed within housing 28, such as, for example, the location depicted for fans 30'. In one exemplary embodiment, heavy load module 10 is approximately 6 inches by 8 inches by 2.5 inches. The dimensions are based on various considerations, including, for example, available wire element sizes, fan sizes, and required resistance and power capability. The selectable connectivity of wires 14,14' individually, in series, or in parallel creates different heavy loads for various types of batteries under test.

Figure 4:
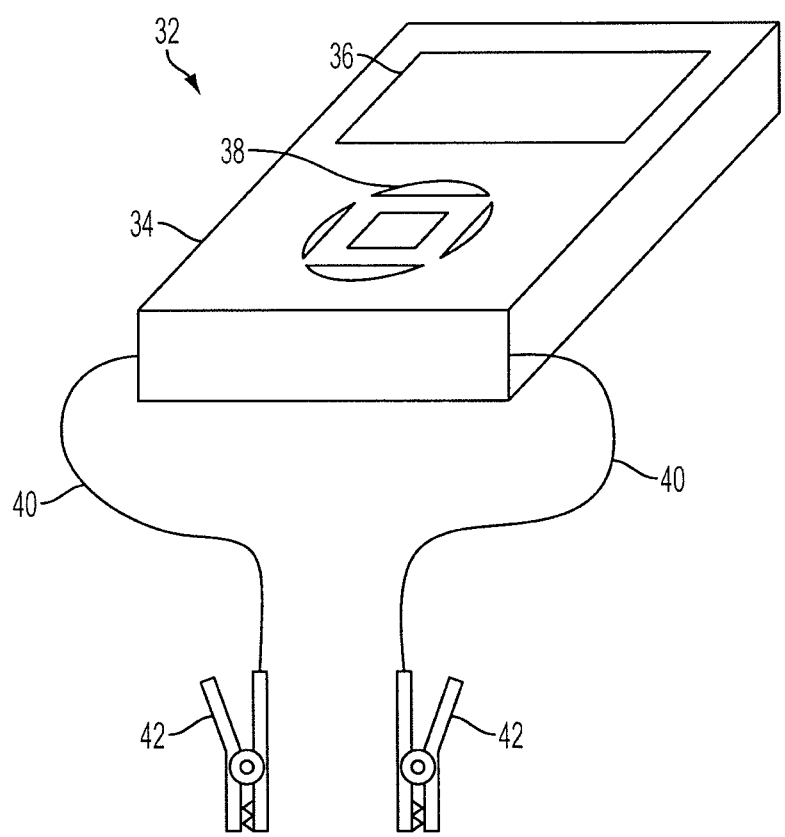
FIG. 4 presents a perspective view of a battery tester, in accordance with an embodiment of the present invention.

FIG. 4 presents a perspective view of a battery tester 32 in accordance with an embodiment of the present invention. Battery tester 32 includes a housing 34 with a display 36 and a plurality of directional and buttons 38. A technician testing a battery engages buttons 38 to advance through a series of identification and testing screens shown on display 36. A set of battery charging wires 40 are attached to housing 34, at the base, for example. At the end of charging wires 40, charge clips 42 connect the battery tester 32 to a test battery (not shown).

Figure 5:
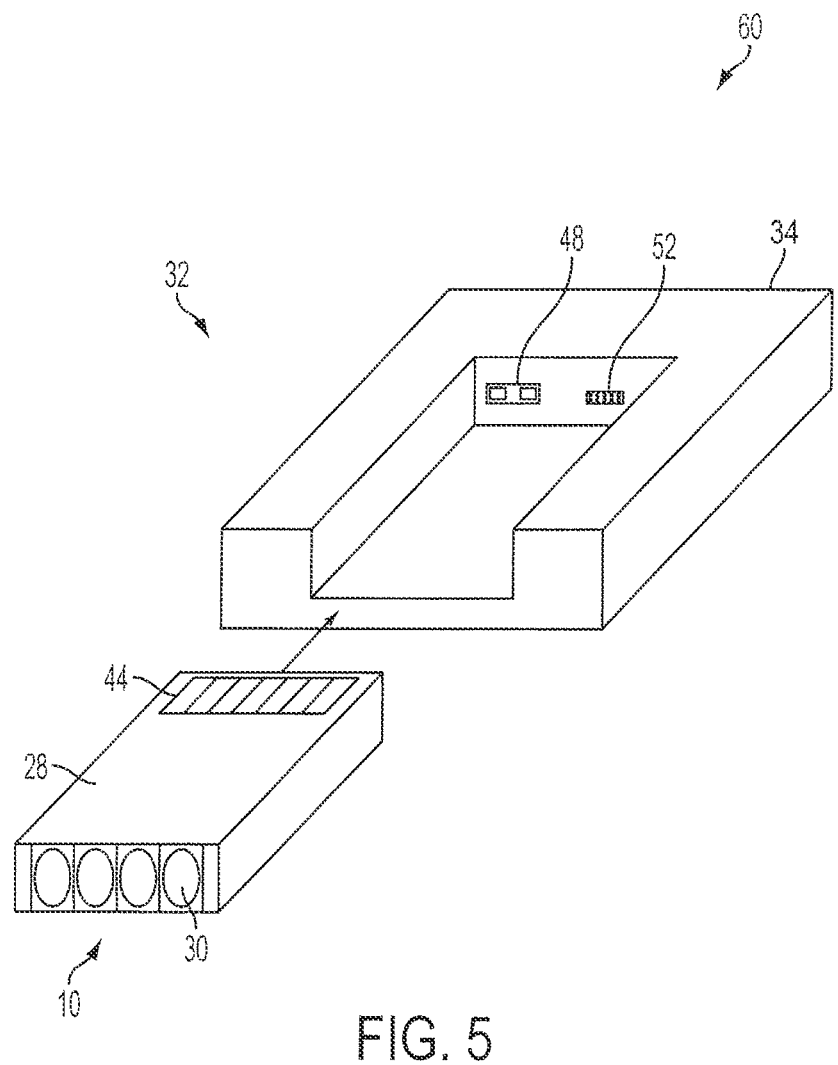
FIG. 5 presents a perspective view of a modular battery test system, in accordance with an embodiment of the present invention.

FIG. 5 presents a perspective view of a modular battery test system 60 in accordance with an embodiment of the present invention. As illustrated therein, heavy load module 10 plugs into the back of the battery tester 32 such that high current connector 18 and control signal connector 22 of heavy load module 10 engage respective high current connector 48 and control signal connector 52 of battery tester 32 (shown in an inverted orientation with respect to FIGS. 3 and 4). Accordingly, FIG. 5 depicts the underside of heavy load module 10. The intake portions of fans 30 are illustrated, along with exhaust vents 44 on the underside of heavy load module 10. In one embodiment, fan switching element(s) (not shown) automatically sense the connection with tester 32 and configure the electrical connections of the fans accordingly, while in another embodiment, the fan switching element(s) receive a fan control signal from battery tester 32, after which the fan control element(s) configure the electrical connections of fans 30.

In one preferred embodiment, heavy load module 10 presents a configurable load to battery tester 32 that consists of wires 14,14' that are electrically configured as an individual load, as a series load or as a parallel load. For a nominal resistance of 0.15 ohms, each wire 14,14' individually handles up to 80 amps of current from a 12 V test battery, and 40 amps when connected in series. When connected in parallel, the configurable load may handle up to 160 amps of current from this 12 V test battery. Similarly, each wire 14,14' may individually handle up to 40 amps of current from a 6 V test battery, and 20 amps when connected in series. When connected in parallel, the configurable load may handle up to 80 amps of current from a 6 V test battery. For a 24 V test battery, 160 amps may be handled in series, or 80 amps individually. A parallel connection may require additional fan cooling capacity, however. The internal controller of the tester 32 can be configured to prevent unsafe electrical configurations from being selected. When connected individually, one of the wires 14,14' is not used, and subsequent individual tests may alternate the use of the wires 14,14'.

Various methods of communicating the presence of heavy load module 10, as well as its capabilities, to the microcontroller (not shown) of battery tester 32 are contemplated by the present invention, including, for example, intelligent connectors, resistance pads, programmable logic, etc. Accordingly, the microcontroller may automatically recognize the presence and capabilities of heavy load module 10, thus enabling the application of specific heavy-load tests in a user menu provided on display 36.

One exemplary method for testing a battery is as follows. After a technician selects a heavy load module 10 that is commensurate with the capacity of the battery to be tested, the technician connects battery tester 32 to the test battery, which verifies that the test battery is in good operating condition prior to the application of one or more heavy load tests. The heavy load module 10 may be connected to battery tester 32 before or after the condition of the test battery is verified. The load configuration of the heavy load module 10 is then selected, and the battery tester 32 sends a control signal to heavy load module 10 to set the load configuration. The test battery is then tested, the connection being maintained for a specified time period, during which the temperature is optionally monitored. In one embodiment, after the timed test is completed, a subsequent heavy load test does not occur until the configurable load has cooled sufficiently to avoid damage. Fans 30 ensure rapid dissipation of the generated heat in a manner safe for the operator.

As discussed above, battery tester 32 may be connected to the test battery with, or without, heavy load module 10 being connected. To verify the operating condition of the battery under test, battery tester 32 may include built-in micro loads. This preliminary test determines whether the test battery has sufficient capacity to provide meaningful results under heavy load conditions. If the test battery is determined to be capable of tolerating the heavy load, the test battery should also have sufficient capacity to operate fans 30 to cool the configurable load. If the test battery is weak or discharged, the heavy load test is preferably not performed. Various data may be collected by battery tester 32 and subsequently analyzed. Battery tester 32 may remain connected to the test battery to allow fans 30 to continue running to dissipate the heat, and may remain engaged until the microcontroller of battery tester 32 indicates that the configurable load has sufficiently cooled, in order to disconnect heavy load module 10 from battery tester 32.

In a further embodiment, more than one heavy load module 10 may be connected to battery tester 32, and the respective connectors and air inflow and exhaust orifices may be arranged accordingly. Specifically, several heavy load modules may be accommodated by designing each module to allow stacking, with suitable switching arrangements such that the configurable loads are connected to the test battery individually, in series, or in parallel configurations. This allows progressively larger loads to be applied for more sophisticated testing. By sizing the resistance values and establishing the connections appropriately, multiple battery voltages of 6V, 12V and 24V can easily be tested with only one or two modules installed.

Alternately, battery test system 60 can be configured to provide single loads suitable for 6V, 12V and 24V battery systems. The end user can remove and attach whichever heavy load module 10 is required. This allows for customization of individual test instruments for the types of businesses most encountered in a particular repair shop. This also allows for the construction of less expensive modules, in which heavy load module 10 is constructed for a fixed battery voltage and requires only one high-current switching element, while all other elements remain the same. In this case, each heavy load module 10 would contain a single element suitable for testing at the required current level in 6V, 12V or 24V systems, and the user would select a particular heavy load module 10 depending on the capacity of the test battery.

Although an example of the system and method is described above, it will be appreciated that other components can be included. For example, a small memory device can be included within the heavy load module 10 to provide at least one of configuration data, calibration data, and temperature data to the microcontroller of the battery tester 32.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A modular heavy load battery test system, comprising:
    a heavy load module, including:
        a housing having a first control signal connector and a first high-current connector;
        a heat-resistant support plate disposed within the housing;
        a first length of high-resistivity, large-gauge wire arranged on an upper surface of the heat-resistant support plate;
        a second length of high-resistivity, large-gauge wire arranged on a lower surface of the heat-resistant support plate;
        a switch, coupled to the first and second wires, the first control signal connector and the first high-current connector, to selectively connect the first and second wires to the first high-current connector based upon a control signal received over the first control signal connector; and
        at least one fan, coupled to the first high current connector and disposed within the housing, to cool the first and second wires; and
    a battery tester, including:
        a housing, having a second high-current connector and a second control signal connector, wherein the second high-current connector and the second control signal connector of the battery tester are configured to separably connect to the first high-current connector and the first control signal connector of the heavy load module;
        a micro controller, coupled to the control connector configured to recognize a presence and capabilities of the heavy load module, said micro controller further configured to enable an application of specific load tests and display the tests in a user menu on a display; and
        a set of battery charging wires, coupled to the second high-current connector, to connect the battery tester to a battery under test.

2. The battery test system of claim 1, wherein the switch selectively connects only the first wire, only the second wire, the first and second wires in series, or the first and second wires in parallel, to the high current connector.

3. The battery test system of claim 1, wherein the heavy load module further comprises a temperature sensor, mounted on the support plate, coupled to the first control signal connector.

4. The battery test system of claim 1, wherein the heavy load module further comprises a fan switching element, coupled to the first control signal connector, that connects at least two fans to the first high-current connector based upon a fan control signal received from the battery tester microcontroller.

5. The battery test system of claim 1, wherein the heavy load module further comprises a memory device providing least one of configuration data, calibration data and temperature data to the micro controller.

6. The battery test system of claim 1, wherein the battery tester housing is adapted to receive at least two heavy load modules.

7. A heavy load module for a battery test system, comprising:
- a housing having a control signal connector and a high-current connector, wherein the control signal connector and the high-current connector are configured to separably connect the heavy load module to the battery test system;
- a heat-resistant support plate disposed within the housing;
- a first length of high-resistivity, large-gauge wire arranged on an upper surface of the heat-resistant support plate;
- a second length of high-resistivity, large-gauge wire arranged on a lower surface of the heat-resistant support plate;
- a switch, coupled to the first and second wires, the control signal connector and the high-current connector, to selectively connect the first and second wires to the high-current connector based upon a control signal received over the control signal connector; and
- at least one fan, coupled to the high current connector and disposed within the housing, to cool the first and second wires,
- wherein the control signal connector is coupled to a micro controller configured to recognize a presence and capabilities of the heavy load module, said micro controller further configured to enable an application of specific load tests and display the tests in a user menu on a display.

8. The heavy load module of claim 7, wherein the switch selectively connects only the first wire, only the second wire, the first and second wires in series, or the first and second wires in parallel, to the high current connector.

9. The heavy load module of claim 7, wherein the heavy load module provides a configuration signal over the control signal connector.

10. The heavy load module of claim 7, further comprising a temperature sensor mounted on the support plate and coupled to the control signal connector.

11. The heavy load module of claim 7, further comprising a fan switching element coupled to the control signal connector and at least two fans.

12. The heavy load module of claim 11, wherein the fan switching element connects the fans to the high-current connector based upon a fan control signal received over the control signal connector.

13. The heavy load module of claim 11, wherein the fans includes four, 6 volt fans, and the fan switching element is adapted to connect the fans to the high-current connector based upon a voltage of a test battery.

14. The heavy load module of claim 13, wherein the fan switching element connects the fans to the high-current connector in a parallel configuration for a 6 volt test battery, in a series-parallel configuration for a 12 volt test battery, and in a series configuration for a 24 volt test battery.

15. The heavy load module of claim 7, further comprising a memory device, providing at least one of configuration data, calibration data and temperature data to the micro controller.

16. The heavy load module of claim 7, wherein the first and second wires are made from FeCrAl Alloy 919, have a wire gauge of approximately 0, have a nominal resistance of approximately 0.15 ohms, and dissipate approximately 80 A of current from a 12 volt DC source.

17. A method for testing a battery using a heavy load, the method comprising the steps of:
- providing a heavy load module based upon a capacity of a battery under test, the heavy load module including a housing having a control signal connector and a high-current connector;
- connecting separately, with the control signal connector and the high-current connector, the heavy load module to a battery analyzer
- recognizing, with a micro controller coupled to the control signal connector, a presence and capabilities of the heavy load module;
- enabling, with the micro controller, an application of specific load tests; and
- displaying, with the micro controller, the tests in a user menu on a display.

18. The method of claim 17, further comprising cooling a configurable load using a plurality of fans disposed within the housing, wherein the configurable load includes first and second lengths of high-resistivity, large-gauge wire coupled to a switch and respectively arranged on upper and lower surfaces of a heat-resistant plate.

19. The method of claim 18, wherein configuration of the load includes connecting only the first wire to the battery analyzer, connecting only the second wire to the battery analyzer, connecting the first and second wires to the battery analyzer in series, or connecting the first and second wires to the battery analyzer in parallel.

* * * * *